US011119196B2

(12) United States Patent
Bulteel

(10) Patent No.: US 11,119,196 B2
(45) Date of Patent: Sep. 14, 2021

(54) FIRST PHOTON CORRELATED TIME-OF-FLIGHT SENSOR

(71) Applicant: OmniVision Technologies, Inc., Santa Clara, CA (US)

(72) Inventor: Olivier Bulteel, Oslo (NO)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 31 days.

(21) Appl. No.: 16/664,236

(22) Filed: Oct. 25, 2019

(65) Prior Publication Data
US 2020/0058698 A1 Feb. 20, 2020

Related U.S. Application Data

(62) Division of application No. 15/958,434, filed on Apr. 20, 2018, now Pat. No. 10,497,738.

(51) Int. Cl.
G01S 7/4863 (2020.01)
H01L 27/146 (2006.01)
(Continued)

(52) U.S. Cl.
CPC .......... G01S 7/4863 (2013.01); G01S 17/894 (2020.01); G02B 27/0977 (2013.01);
(Continued)

(58) Field of Classification Search
CPC .... G01S 7/4863; G01S 17/894; G01S 7/4816; G01S 7/487; G01S 7/4865; G01S 17/89;
(Continued)

(56) References Cited

U.S. PATENT DOCUMENTS 6,522,395 B1   2/2003   Bamji et al.
8,724,096 B2   5/2014   Gosch et al.
(Continued)

FOREIGN PATENT DOCUMENTS

CN   105738910 A   7/2016
TW   201312144 A   3/2013

OTHER PUBLICATIONS

Cristiano Niclass et al., "A 100-m Range 10-Frame/s 340 96-Pixel Time-of-Flight Depth Sensor in 0.18- m CMOS", IEEE Journal of Solid-State Circuits, vol. 48, No. 2, Feb. 2013 (Year: 2013).*
(Continued)

Primary Examiner — Patricia D Reddington
(74) Attorney, Agent, or Firm — Christensen O'Connor Johnson Kindness PLLC

(57) ABSTRACT

A time-of-flight (TOF) sensor includes a light source, a plurality of avalanche photodiodes, and a plurality of pulse generators. Control circuitry is coupled to the light source, the plurality of avalanche photodiodes, and the plurality of pulse generators, and the control circuitry includes logic that when executed by the control circuitry causes the time-of-flight sensor to perform operations. The operations include emitting the light from the light source, and receiving the light reflected from an object with the plurality of avalanche photodiodes. A plurality of pulses is output from the individual pulse generators corresponding to the individual avalanche photodiodes that received the light, and a timing signal is output when the plurality of pulses overlap temporally. A time is calculated when a first avalanche photodiode in the plurality of avalanche photodiodes received the light.

9 Claims, 6 Drawing Sheets

(51) Int. Cl.
| | |
|---|---|
| *G02B 27/09* | (2006.01) |
| *G06T 7/50* | (2017.01) |
| *H01L 31/107* | (2006.01) |
| *G02B 30/00* | (2020.01) |
| *G01S 17/894* | (2020.01) |
| *H01L 31/02* | (2006.01) |

(52) U.S. Cl.
CPC ............. *G02B 30/00* (2020.01); *G06T 7/50* (2017.01); *H01L 27/14643* (2013.01); *H01L 31/107* (2013.01); *G06T 2200/08* (2013.01); *H01L 27/1463* (2013.01); *H01L 27/14603* (2013.01); *H01L 31/02002* (2013.01); *H01L 31/02027* (2013.01)

(58) Field of Classification Search
CPC ............. G02B 30/00; G02B 27/0977; H01L 27/14643; H01L 31/107; H01L 31/02027; H01L 27/1463; H01L 27/14603; H01L 31/02002; G06T 7/50; G06T 2200/08; G01J 2001/4466; G01J 1/44
See application file for complete search history.

(56) References Cited

U.S. PATENT DOCUMENTS

| | | | |
|---|---|---|---|
| 9,325,920 | B2 | 4/2016 | Van Nieuwenhove et al. |
| 9,599,712 | B2 | 3/2017 | Van Der Tempel et al. |
| 9,791,568 | B2 | 10/2017 | Bloomfield et al. |
| 10,034,111 | B1 | 7/2018 | Barbier et al. |
| 10,291,895 | B2 | 5/2019 | Bulteel et al. |
| 10,313,356 | B2 | 6/2019 | Raynor |
| 10,497,738 | B2 | 12/2019 | Bulteel |
| 10,557,925 | B2 | 2/2020 | Wang et al. |
| 2006/0034142 | A1* | 2/2006 | Ooishi ............... G11C 8/10 365/230.06 |
| 2006/0140044 | A1* | 6/2006 | Kang ................ G11C 7/222 365/193 |
| 2008/0135736 | A1* | 6/2008 | Koiwai ............ H01L 31/02027 250/214 AG |
| 2008/0254319 | A1* | 10/2008 | Hosokawa ............ C09K 11/06 428/704 |
| 2012/0154786 | A1 | 6/2012 | Gosch et al. |
| 2013/0153754 | A1 | 6/2013 | Drader et al. |
| 2013/0181119 | A1 | 7/2013 | Bikumandla et al. |
| 2014/0021450 | A1* | 1/2014 | Young ............... H01L 51/003 257/40 |
| 2014/0160461 | A1 | 6/2014 | Van Der Tempel et al. |
| 2014/0313376 | A1 | 10/2014 | Van Nieuwenhove et al. |
| 2016/0109562 | A1 | 4/2016 | Fowler et al. |
| 2016/0187484 | A1 | 6/2016 | Bloomfield et al. |
| 2017/0187721 | A1 | 6/2017 | Raynor |
| 2017/0363467 | A1 | 12/2017 | Clemens et al. |
| 2018/0059224 | A1 | 3/2018 | Wang et al. |
| 2018/0115762 | A1 | 4/2018 | Bulteel et al. |
| 2018/0123611 | A1* | 5/2018 | Dutton ................ G01S 7/4863 |
| 2019/0302240 | A1 | 10/2019 | Webster et al. |
| 2019/0326347 | A1 | 10/2019 | Bulteel |
| 2020/0058698 | A1 | 2/2020 | Bulteel |

OTHER PUBLICATIONS

Sergio Hernandez-Marin et al., "Bayesian Analysis of Lidar Signals with Multiple Returns", IEEE Transactions on Pattern Analysis and Machine Intelligence, vol. 29, No. 12, Dec. 2007 (Year: 2007).*
First Sensor AG, 'The Importance of Avalanche Photodiode (APD) for LIDAR Applications', Saved from URL: https://www.azosensors.com/article.aspx?ArticleID=864, Sep. 7, 2017 (Year: 2017).*
Taiwanese Office Action dated Nov. 29, 2019 for Taiwanese Application No. 108113736, 16 pages.
Niclass et al., "A 100m-Range 10-Frame/s 340×96-Pixel Time-of-Flight Depth Sensor in 0.18μm CMOS," 2011 European Solid-State Circuits Conference, ISBN: 978-1-4577-0704-9/11, 4 pages.
Perenzoni et al., "A 64×64-Pixel Digital Silicon Photomultiplier Direct ToF Sensor with 100MPhotons/s/pixel Background Rejection and Imaging/Altimeter Mode with 0.14% Precision up to 6km for Spacecraft Navigation and Landing," 2016 IEEE International Solid-State Circuits Conference, Session 6, Image Sensors, 6.5, ISBN: 978-1-4673-9467-3/16, 4 pages.
U.S. Appl. No. 15/958,364, Correlated Time-of-Flight Sensor, filed Apr. 20, 2018, 25 pages.
"The Importance of Avalanche Photodiode (APD) for LIDAR Applications," First Sensor AG, Sep. 7, 2017, saved from URL: https://www.azosensors.com/article.aspx?ArticleID=864, 5 pages.
Hernandez-Marin et al., "Bayesian Analysis of Lidar Signals with Multiple Returns," IEEE Transactions on Pattern Analysis and Machine Intelligence, vol. 29, No. 12, Dec. 2007, pp. 2170-2180.
(ROC) Taiwan Patent Application No. 108113736—Taiwanese Office Action with English translation dated Apr. 30, 2020, 7 pages.
ROC (Taiwan) Patent Application No. 108113737—Office Action with English Translation, dated Nov. 29, 2019, 15 pages.
ROC (Taiwan) Patent Application No. 108113737—Office Action with English Translation, dated Apr. 30, 2020, 7 pages.
(ROC) Taiwan Patent Application No. 108113736—Taiwanese Office Action with English translation dated Nov. 29, 2019, 16 pages.

* cited by examiner

FIRST PHOTON CORRELATED TIME-OF-FLIGHT SENSOR

CROSS-REFERENCE TO RELATED APPLICATIONS

This application is a divisional of U.S. patent application Ser. No. 15/958,434, filed on Apr. 20, 2018, the contents of which are incorporated by reference in their entirety.

TECHNICAL FIELD

This disclosure relates generally to optical sensors. In particular, examples of the present invention are related to time-of-flight sensors.

BACKGROUND INFORMATION

Interest in three dimension (3D) cameras is increasing as the popularity of 3D applications continues to grow in areas such as imaging, movies, games, computers, user interfaces, facial recognition, object recognition, augmented reality, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the three dimensional images. In addition, this technique is complex and therefore requires significant computer processing power in order to create the 3D images in real time.

For applications that require the acquisition of 3D images in real time, active depth imaging systems based on time-of-flight measurements are sometimes utilized. Time-of-flight cameras typically employ a light source that directs light at an object, a sensor that detects the light that is reflected from the object, and a processing unit that calculates the distance to the objected based on the round-trip time it takes for the light to travel to and from the object.

A continuing challenge with the acquisition of 3D images is balancing the desired performance parameters of the time-of-flight camera with the physical size and power constraints of the system. For example, the power requirements of time-of-flight systems meant for imaging near and far objects may be considerably different. These challenges are further complicated by extrinsic parameters (e.g., desired frame rate of the camera, depth resolution and lateral resolution) and intrinsic parameters (e.g., quantum efficiency of the sensor, fill factor, jitter, and noise).

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
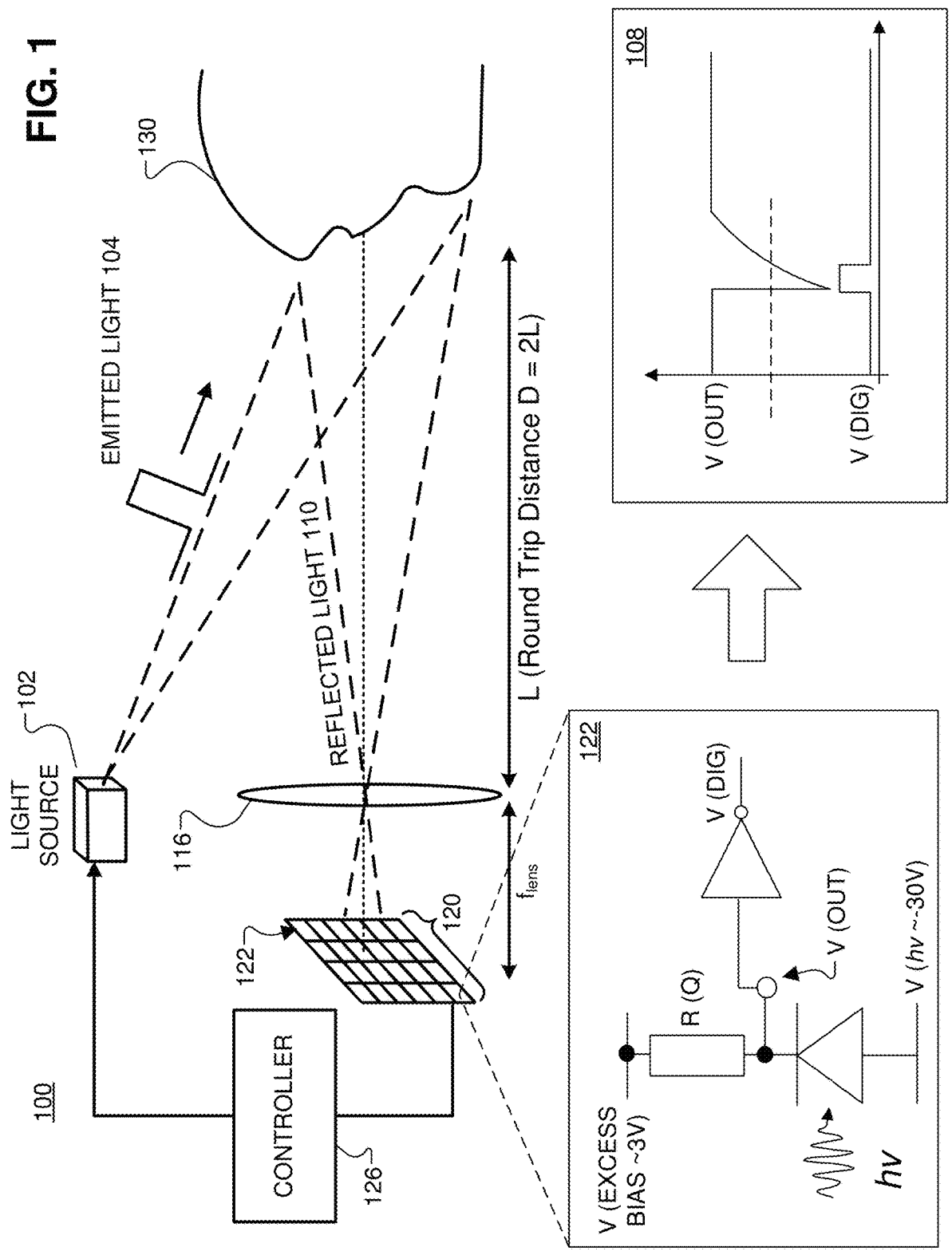
FIG. 1 is a diagram that shows one example of a time-of-flight (TOF) sensor, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a first photon correlated time-of-flight sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

A single photon avalanche photodiode (SPAD) is photodiode that is biased around its avalanche point to absorb and detect single photons. When the SPAD is properly biased in Geiger mode (with reverse voltage above the avalanche breakdown value), it waits for a charge to enter its internal electrical field and trigger an avalanche. Each avalanche generates a pulse. Since the SPAD has an inner jitter <100 ps, SPADs can be used to time measurements with high precision.

Generally, time-of-flight image sensors work by emitting light (e.g., coherent pulses of light, which may be from a monochromatic light source like a laser diode or the like). The pulses of light are reflected and received by the image sensor or camera. The time-of-flight for the photons to travel from the system to an object and return to the system is measured and used to determine distance. See e.g., FIG. 1 and associated discussion for one example of a time-of-flight system.

Free charge carriers, that are not related to the absorption of incident light, may sometimes be generated in the biased semiconductor material (e.g., silicon, germanium, etc.). These carriers may be generated randomly at a rate called the "dark count rate" (DCR). Similarly, a background light photon, can also be absorbed at any time (randomly) during the exposure. The background light photon occurrence is more or less stochastic depending on the illumination level (Poisson distribution) and should be different for pixels under the same background illumination. A synchronous light photon occurs when a return pulse of light—that was emitted from the light source in the system—hits the sensor. This is thus not stochastic and should be similar for pixels receiving the same signal.

By summing all inputs of a group of N SPADs over a large number of frames, one can obtain a histogram of data (see e.g., FIG. 2) for a homogenous scene. However, background light and/or DCR also causes SPAD breakdown at random times, distributed more or less equally over the full integration period. Using SPADs for time-of-flight (TOF) distance measurements generally implies dealing with a lot of data due to background light and DCR. In some SPAD time-of-flight sensors, the device may take a large number of frames to build a histogram (see e.g., FIG. 2) and distinguish a return signal from background and DCR. However, this requires storing and processing data, and filtering the histogram to find the signal peak among all the data. These steps may require lots of memory and processing power. Moreover, by averaging a histogram filled with noise, it is possible to calculate a wrong estimation for the return signal.

Accordingly, proposed here is a calculation of overlapping (correlated) pulses (generated in response to a SPAD receiving a photon) in order to reduce error and the processing power required to calculate the time-of-flight and subsequent distance measurements. This is achieved by outputting a timing signal for the correlated pulses. Additionally, the instant disclosure further calculates when the first photon in a reflected light pulse is received, and when a last photon in a reflected light pulse is received. This may be achieved by measuring the rising and falling edges of the timing signal. If the timing for the first and last photon is known, the system can measure the correlation (time between first and last photons). This indicates the reflectivity of the target and is desirable in LiDAR applications.

FIG. 1 is a block diagram that shows one example of a time-of-flight system 100 in accordance with the teachings of the present disclosure. Time-of-flight system 100 includes light source 102, lens 116, plurality of pixels 120 (including first pixel 122), and controller 126 (which includes control circuitry, memory, etc.). Controller 126 is coupled to light source 102, and plurality of pixels 120 (including first pixel 122). Plurality of pixels 120 is positioned at a focal length $f_{lens}$ from lens 116. As shown in the example, light source 102 and lens 116 are positioned at a distance L from object 130. It is appreciated that FIG. 1 is not illustrated to scale and that in one example the focal length $f_{lens}$ is substantially less than the distance L between lens 116 and object 130. Therefore, it is appreciated that for the purposes of this disclosure, the distance L and the distance L+focal length $f_{lens}$ are substantially equal for the purposes of time-of-flight measurements in accordance with the teachings of the present invention. As illustrated, plurality of pixels 120, and controller 126 are represented as separate components. However, it is appreciated that plurality of pixels 120 and controller 126 may all be integrated onto a same stacked chip sensor and may also include a time-to-digital converter (or a plurality of time-to-digital converters, with each pixel of four or more SPADs associated with a corresponding one of the plurality of time-to-digital converters). In other examples, plurality of pixels 120, and controller 126 may be integrated onto a non-stacked planar sensor. It is also appreciated that each pixel (or even each SPAD) may have a corresponding memory for storing digital bits or signals for counting detected photons.

Time-of-flight system 100 may be a 3D camera that calculates image depth information of a scene to be imaged (e.g., object 130) based on time-of-flight measurements with plurality of pixels 120. Each pixel in plurality of pixels 120 determines depth information for a corresponding portion of object 130 such that a 3D image of object 130 can be generated. Depth information is determined by measuring a round-trip time for light to propagate from light source 102 to object 130 and back to time-of-flight system 100. As illustrated, light source 102 (e.g., a vertical-cavity surface-emitting laser) is configured to emit light 104 to object 130 over a distance L. Emitted light 104 is then reflected from object 130 as reflected light 110, some of which propagates towards time-of-flight system 100 over a distance L and is incident upon plurality of pixels 120 as image light. Each pixel (e.g., first pixel 122) in plurality of pixels 120 includes a photodetector (e.g., one or more single-photon avalanche diodes) to detect the image light and convert the image light into an electric signal (e.g., image charge).

As shown in the depicted example, the round-trip time for pulses of the emitted light 104 to propagate from light source 102 to object 130 and back to plurality of pixels 120 can be used to determine the distance L using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ corresponds to the round-trip time which is the amount of time that it takes for pulses of the light to travel to and from the object as shown in FIG. 1. Accordingly, once the round-trip time is known, the distance L may be calculated and subsequently used to determine depth information of object 130. Controller 126 is coupled to plurality of pixels 120 (including first pixel 122), and light source 102 and includes logic that when executed causes time-of-flight system 100 to perform operations for determining the round-trip time.

As shown, individual pixels (e.g., first pixel 122) may include a SPAD coupled to a quenching circuit (e.g., resistor R (Q)), and an analog to digital voltage converter (represented in the current example as an inverter) is coupled between the SPAD and the quenching circuit. As shown in graph 108, when a photon is received, a large voltage drop (e.g., V (OUT)) occurs in the SPAD but then the voltage is returned to a steady state voltage via the quenching circuit. A digital waveform is output from the analog to digital converter in response to the avalanche breakdown occurring in the diode.

In some examples, time-of-flight sensor 100 is included in a handheld device (e.g., a mobile phone, a tablet, a camera, etc.) that has size and power constraints determined, at least in part, based on the size of the device. Alternatively, or in addition, time-of-flight system 100 may have specific desired device parameters such as frame rate, depth resolution, lateral resolution, etc. In some examples, time-of-flight sensor 100 is included in a LiDAR system.

Figure 2:
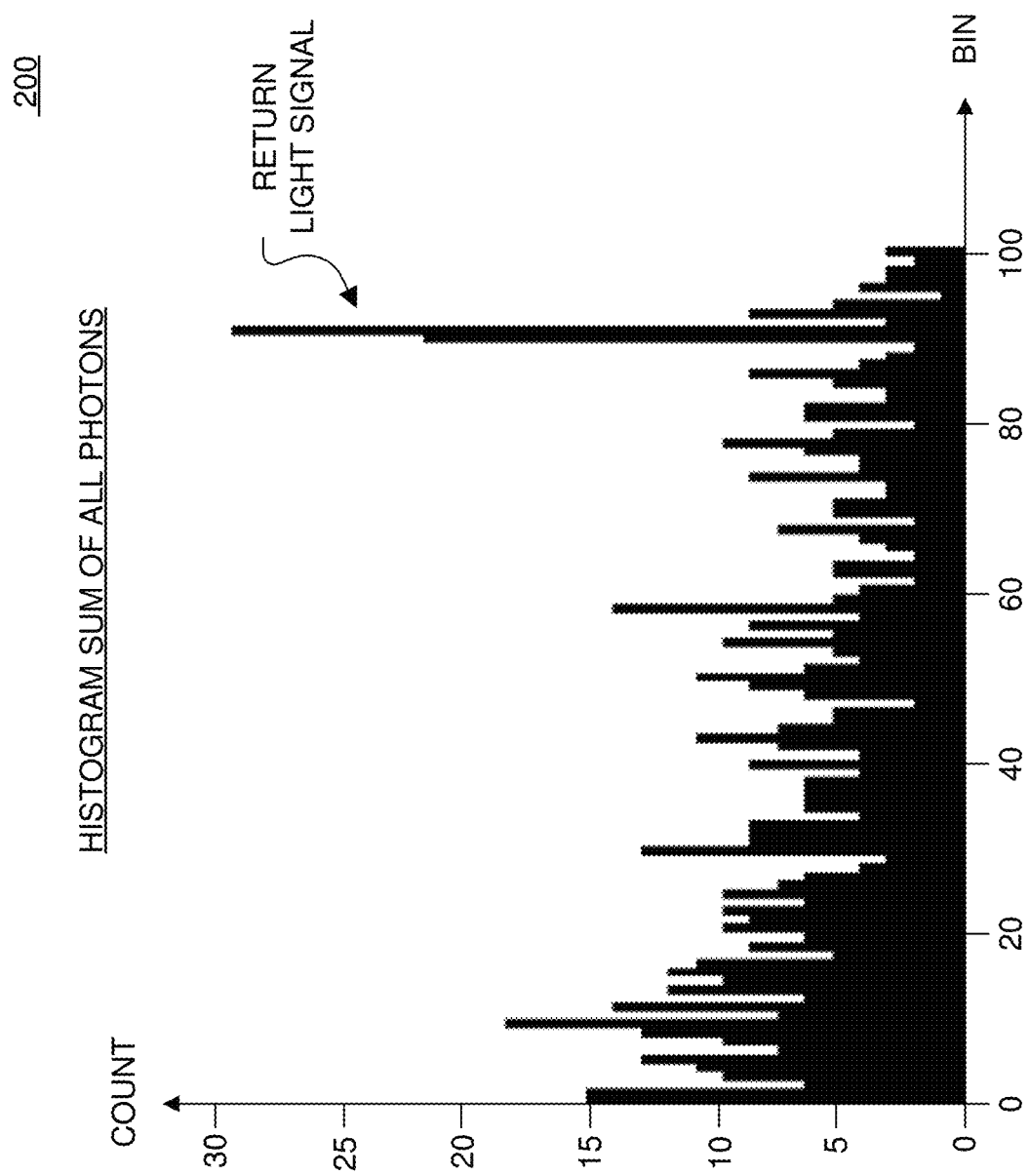
FIG. 2 illustrates time-of-flight data from an example time-of-flight sensor that is not the sensor of FIG. 1.

FIG. 2 illustrates a histogram 200 showing a sum of all photons from an example time-of-flight sensor that is not the sensor of FIG. 1. As shown in FIG. 2 and described above, by summing all inputs of a group of N SPADs over a large number of frames, one can obtain a histogram 200 of data.

The depicted example represents data from four SPADs over 100 frames. As shown, the return light signal occurred at time corresponding to the bin 90. The background light and/or DCR caused triggering at random times, distributed more or less equally over the full integration period, from 0 to 100 bins. Thus, as illustrated, using SPADs for time-of-flight distance measurements generally implies dealing with a lot of data due to background light and DCR, since the system needs to take a large number of frames to build histogram 200 and distinguish a return signal from background light and DCR. This requires lots of memory and processing power. As described below, examples in accordance with the teachings of the present disclosure provide an architecture that may be used with the system in FIG. 1 in order to avoid storing large quantities of data as a histogram, and also reduce the processing power required to calculate time-of-flight measurements.

Figure 3A:
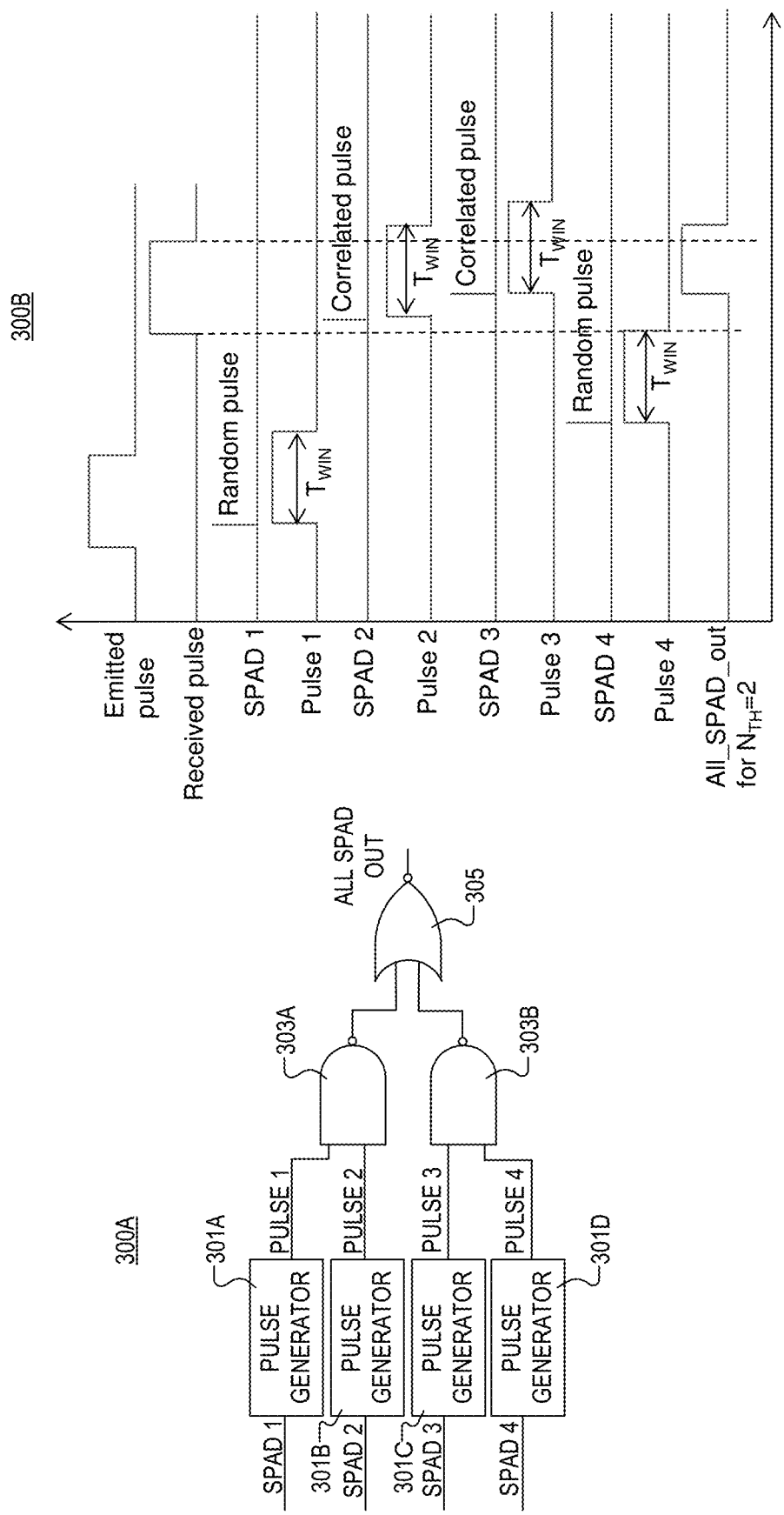
FIGS. 3A-3B show examples of logic, and timing of the logic, that may be implemented in the time-of-flight sensor of FIG. 1, in accordance with the teachings of the present disclosure.

FIG. 3A shows one example of logic 300A, and timing of the logic 300B, that may be implemented in the time-of-flight sensor of FIG. 1, in accordance with the teachings of the present disclosure. The logic 300A, and timing of the logic 300B, depicted, makes binning of time-of-flight data unnecessary and therefore cuts down on the required memory and processing for the system, because no histogram data (like that depicted in FIG. 2) is generated. By using photon arrival time correlation, the system is able to suppress the amount of background noise and DCR data. It is appreciated that the "logic" shown here and elsewhere may be implemented in hardware, software, or a combination of the two.

As shown in the logic diagram 300A, each SPAD (e.g., SPADs 1-4) is coupled to a respective pulse generator 301A-301D. As shown, each avalanche event from the SPADs is received by pulse generators 301A-301D and the pulse generators output a pulse with a specific width ($T_{WIN}$). The pulses are then received by two NAND gates 303A and 303B, and the output of NAND gates 303A and 303B are received by NOR gate 305. Thus the system then only processes the overlap of the output from the pulse generators: effectively AND-gating all inputs (one of skill in the art will appreciate that AND(A,B,C,D)=NOR[NAND(A,B), NAND(C,D)]). Thus the all-SPAD output sends out a pulse only where the pulses from the pulse generators overlapped temporally. By doing so, the system only accepts pulses that are within a $T_{WIN}$ interval (and are thus correlated). The system could also accept less restrictive combinations. It is possible that a 4-input logic diagram can have a variable threshold for the number of overlapping input pulses. One of ordinary skill in the art will appreciate that logic diagram 300A is just one example logic diagram, and there are many equivalent circuits that can achieve the same or similar result. Moreover, the diagram employs four SPADs, and for architectures with more than four SPADs additional combinations will need to be verified, requiring additional logic.

The operations of logic 300A are depicted in timing diagram 300B where a light pulse (e.g., from an IR laser) is emitted, and the received light pulse is incident on the sensor. In the present case, the threshold of detection of overlapping pulses has been set to two. So the system would only process if any combination of two inputs are correlated over a $T_{WIN}$ interval. As shown, SPAD 1 broke down randomly (e.g., due to stray light or DCR) unrelated to when the received light pulse hit the camera. SPAD 2 broke down due to a photon from the received light pulse (which created one of the "correlated pulses"). SPAD 3 also broke down due to a photon from the received light pulse. Like SPAD 1, SPAD 4 broke down randomly (e.g., due to stray light or DCR), and not when the light pulse was received. Regardless of when or why an individual SPAD breaks down, its respective pulse generator (e.g., pulse generator 301A-301D) will output an electrical pulse. Because, in the depicted example, SPADs 2 and 3 broke down close together (temporally) within an interval $T_{WIN}$ the pulses emitted by their respective pulse generators overlap for a period of time. Accordingly, the "all SPAD output" (e.g., NOR gate 305) sends out a timing signal (e.g., AND(PULSE 2, PULSE 3)). Since the other pulses (pulse 1 and 4) did not occur within the same temporal window, nothing is output as a result of these pulses. Accordingly, the system will only output a timing signal when a plurality of SPADs break down within a short $T_{WIN}$ temporal window (e.g., when a light pulse is received by the sensor system). Thus no binning or excessive processing is required since the system only registers a light pulse when an actual reflected light pulse is received. Put another way, only the data output for the SPADs that have triggered/broke down within an interval $T_{WIN}$ will be processed by one or more time to digital converters (TDCs).

In the depicted example a cluster of four SPADs was used. A cluster of these four SPADs may form a single pixel for use with one or more TDCs. However, one of skill in the art will appreciate that any number of SPADs may be used with one or more TDCs (e.g., six SPADs per TDC, eight SPADs per TDC, etc.), in accordance with the teachings of the present disclosure. In a chip, there will be many clusters of SPADs. For example in some time-of-flight sensors there may be (320×240) SPADs, and clusters of 2×2 SPADs may form a pixel. Accordingly, the system has 160×120=19200 pixels.

Figure 3B:
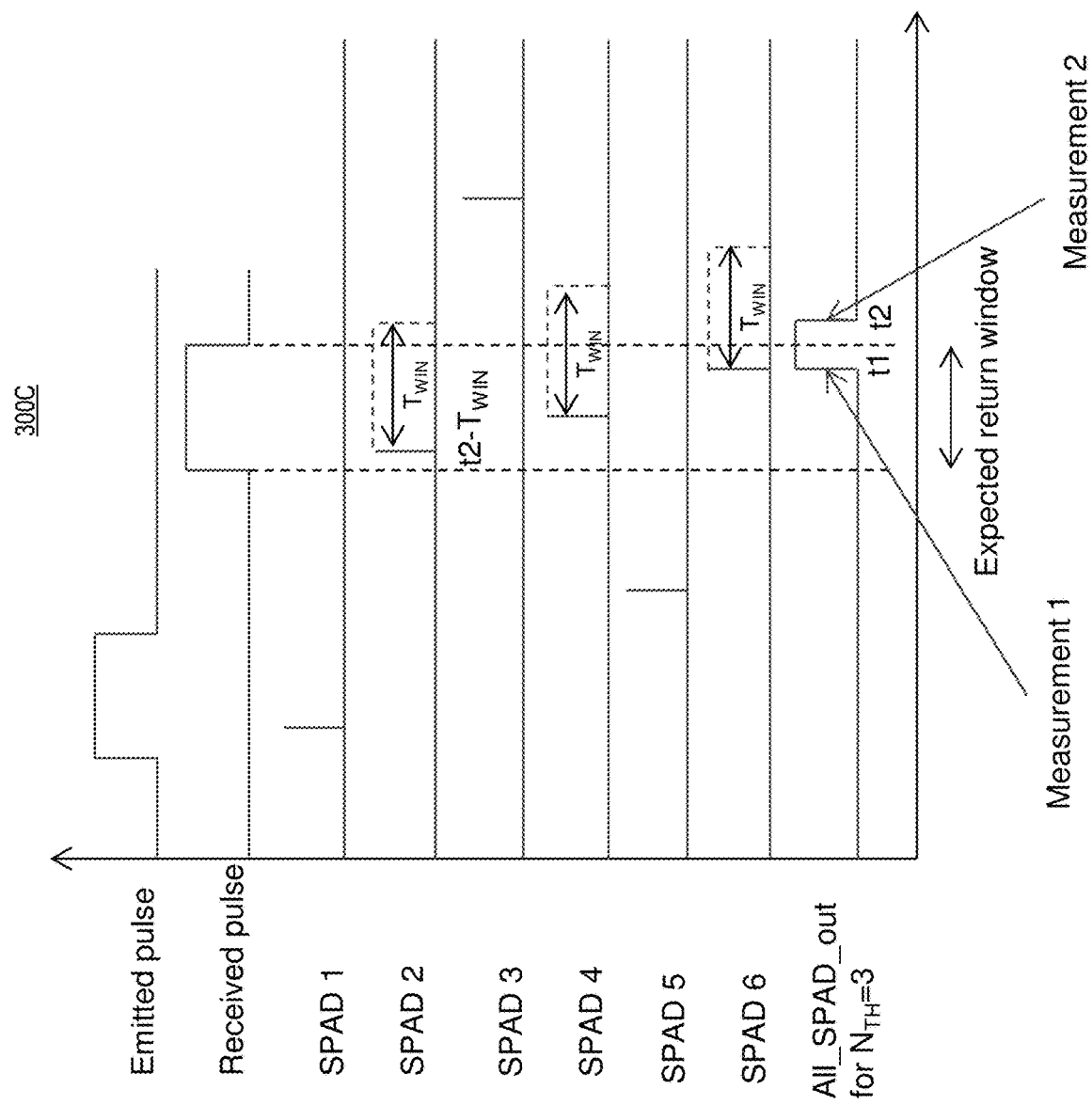

FIG. 3B depicts timing diagram 300C which is similar to timing diagram 300B in FIG. 3A. However, FIG. 3B shows timing for a circuit with six SPADs that are all gated together (not just four). In the depicted example, it takes three SPADs all firing within the span of $T_{WIN}$ to generate a timing signal. Also, timing diagram 300C has been labeled to better illustrate how the rising edge and the falling edge of the timing signal may be used to calculate when the first photon is received with a SPAD and when the last photon is received with a SPAD. It is appreciated that this information may be used to calculate reflectivity, in accordance with the teachings of the present disclosure.

As shown, t1 is the arrival time of the last photon (rising edge), which caused the timing signal to be produced; t2 is the falling edge of the first photon's generated pulse, which caused the timing signal to end. Accordingly, t2−$T_{WIN}$ is the arrival time of the first photon. Thus, the arrival time of both the first and last photons to hit the six pixel system, and that are correlated within $T_{WIN}$ with a number of occurrence of 3, are known. If the system only measures the rising edge of ALL_SPAD_OUT, it measures only the arrival time of the last photon (which can be useful). However, in some examples, the first pulse arrival time may be preferable. By measuring the falling edge, and knowing $T_{WIN}$ (see e.g., calibration test structure 413 in FIG. 4), the system can extract the arrival time of the first photon. The correlation (i.e., the time between first and last photons in a single $T_{WIN}$) may be calculated by subtracting the arrival time of the first photon from the arrival time of the last photon. This may indicate the reflectivity of the target and is highly desirable in LiDAR applications.

Figure 4:
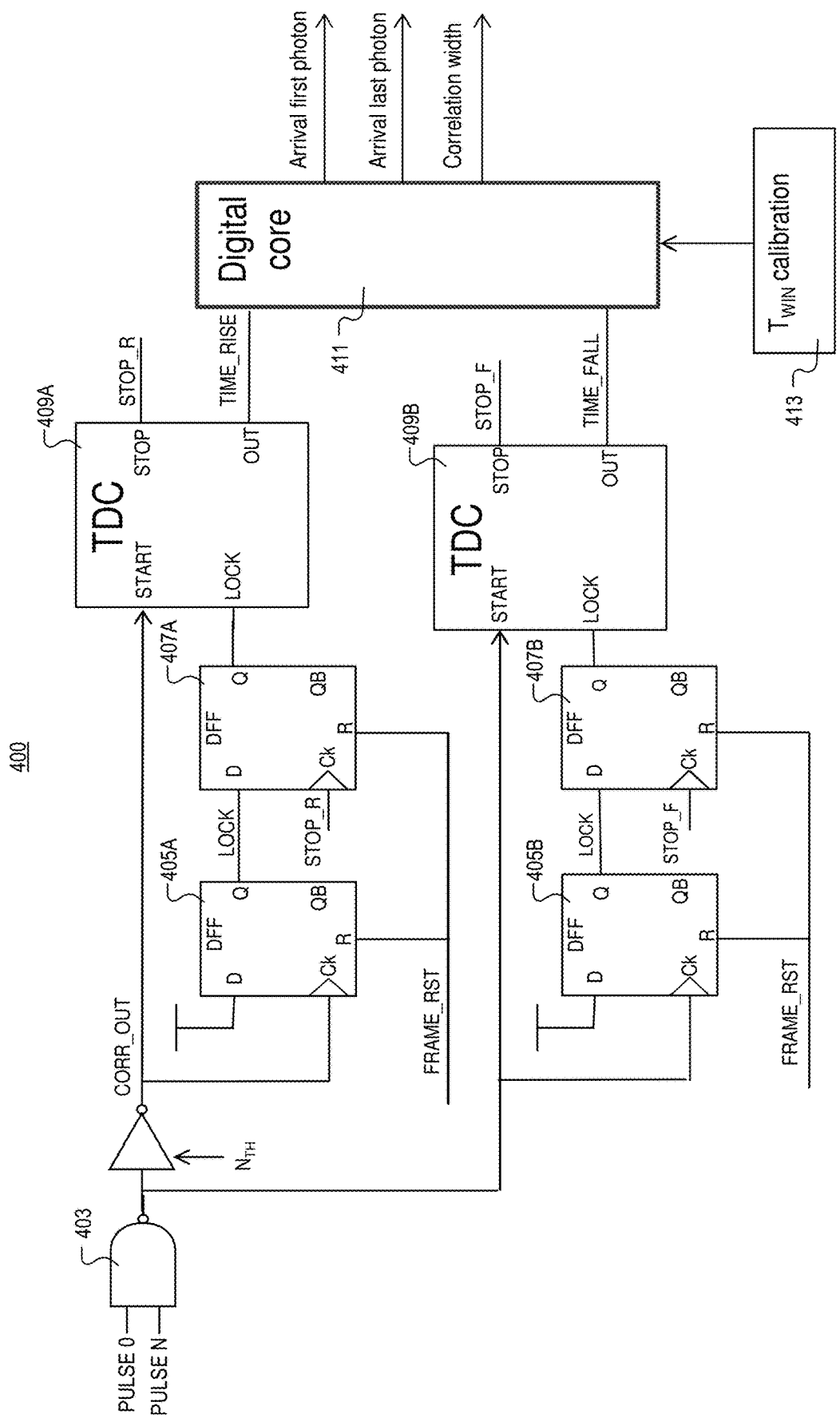
FIG. 4 depicts an example of additional logic that may be included in the time-of-flight sensor of FIG. 1, in accordance with the teachings of the present disclosure.

FIG. 4 depicts additional logic 400 that may be included in the time-of-flight sensor of FIG. 1, in accordance with the teachings of the present disclosure. As depicted, there may be any number of AND gates 403 (see e.g., FIG. 3) which output the timing signal ("CORR_OUT") in response to the SPAD breakdown and subsequent pulse generation by the plurality of pulse generators (e.g., PULSE 0-PULSE N, depicted). The AND gate(s) 403 are coupled to two time to digital converters (TDCs) 409A and 409B. AND gate(s) 403 are also coupled to first D flip-flop 405A, second D flip-flop 407A, third D flip-flop 405B, and fourth D flip-flop 407B. Between first D flip-flop 405A and AND gate(s) 403 are one or more inverters. Second D-flip flop 407A is coupled to first D flip-flop 405A to receive a lock signal. Similarly fourth D-flip flop 407B is coupled to third D flip-flop 405B to receive a lock signal. It is appreciated that once a valid timing signal is read out, the logic depicted may lock (e.g., not output any more time-of-flight measurements) despite additional timing signals being output from the AND gates 403. This makes it so the system needs minimal memory (because only one time-of-flight measurement is calculated per TDC 409A and 409B). Subsequent time-of-flight measurements may be performed once the reset signal is received by first D-flip flop 405A, second D-flip flop 407A, third D-flip flop 405B, and fourth D-flip flop 407B. In some examples, the logic 400 may repeat itself many times in the sensor, and each TDC 409A or 409B has 24 or fewer (e.g., 12) bits of memory.

By having a scheme of consecutive k mini-frames, the device ensures a valid return signal for all pixels after all mini frames. As stated, TDCs 409A 409B will be locked once a valid signal arrives, and be prevented from overwriting if a second valid timing signal occurs for the remaining mini-frames. It is appreciated that the system my repeat many mini-frames and readout the data all at once, after all the mini frames. Each mini frame will include SPAD reset and light pulse emission, and then exposure. Since TDCs 409A and 409B are locked, as stated, there is no need to accumulated additional internal data. The system also conserves power since TDCs 409A and 409B do not perform calculations for other redundant data or background photons.

In the depicted example, TDCs 409A and 409B are also coupled to digital core 411 which may calculate the arrival time of the first photon, the arrival time of the last photon, and the correlation (which may be used to calculate reflectivity of the target). Digital core 411 may include a microcontroller or the like, and may have memory such as RAM, ROM, or the like. As stated above, in order to perform all of these calculations it may be necessary for the system to know the actual pulse width output from the pulse generators. Accordingly, calibration test structure 413 is coupled to digital core 411 and calibrates the system to know the true value of $T_{WIN}$.

Figure 5:
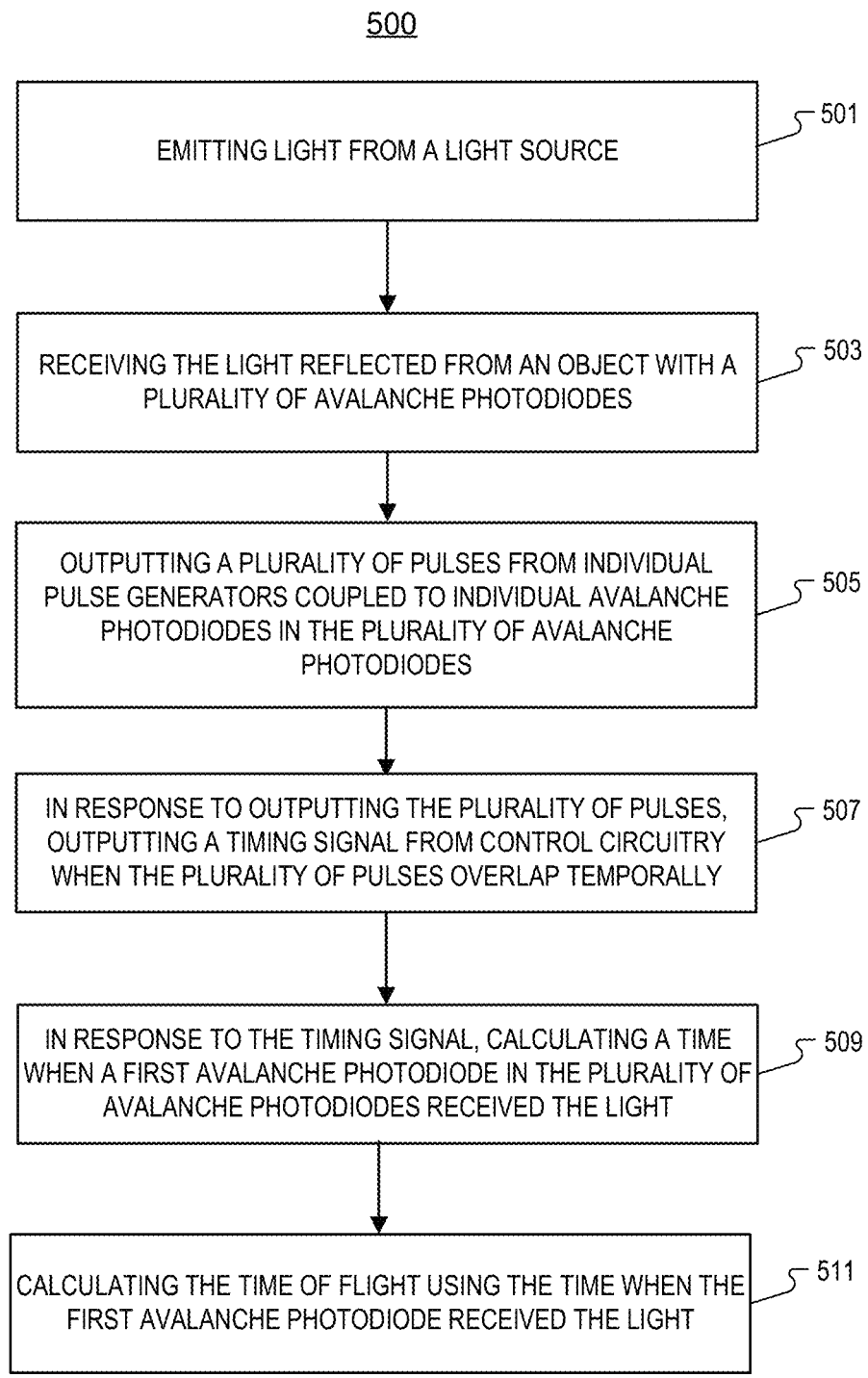
FIG. 5 illustrates an example method of calculating time-of-flight, in accordance with the teachings of the present disclosure.

FIG. 5 illustrates an example method 500 of calculating time-of-flight, in accordance with the teachings of the present disclosure. One of skill in the art will appreciate that blocks 501-509 in method 500 may occur in any order and even in parallel. Moreover blocks may be added to or removed form method 500 in accordance with the teachings of the present disclosure.

Block 501 shows emitting light from a light source structured to emit the light (e.g., a diode with the correct bandgap). In some examples, the light is emitted with a laser emitter which may be visible (e.g., a red, green, or blue laser) or non-visible (e.g., infrared or ultraviolet laser). In other examples, non-laser diodes may be employed. In some examples, the control circuitry (e.g., specific processor containing logic described above, general purpose processor, or the like) is coupled to the light source to control the light source and emit light pulses at intervals that are pre-defined or determined during operation (e.g., depending on the ambient light conditions, the type and frequency of light pulses emitted from the light source may change).

Block 503 illustrates receiving the light pulse reflected from an object with a plurality of avalanche photodiodes structured to receive the light (e.g., a correct bias voltage applied to the photodiodes, and the photodiodes include a semiconductor with the right bandgap). The individual photons reflected from the object may cause the plurality of avalanche photodiodes to break down. This may cause an analog drop in voltage in the diode. The drop in voltage may then be quenched with a quenching circuit coupled to the plurality of avalanche photodiodes. The quench may return the internal voltage of the avalanche photodiodes back to a baseline level.

Block 505 shows, in response to receiving the light with the plurality of avalanche photodiodes, outputting a plurality of pulses from individual pulse generators coupled to individual avalanche photodiodes in the plurality of avalanche photodiodes. The individual pulse generators that output the pulses are coupled to the individual avalanche photodiodes that received the light. One example of the individual pulse generators may be an inverter, and when the voltage drop across the avalanche photodiode reaches a certain threshold, the inverter outputs a digital signal. The width of the digital signal may be responsive to the amount of time that the analog signal is above (or below) the threshold value of the inverter (see e.g., FIG. 1). In other examples, other circuitry may be used to generate a pulse with a predetermined fixed pulse-width. It is appreciated that the pulse width may be pre-programmed into the device or maybe adjusted with use (e.g., by the user, automatically depending on light conditions, or the like).

Block 507 illustrates in response to outputting the plurality of pulses, outputting a timing signal from control circuitry when the plurality of pulses overlap temporally. For example several avalanche photodiodes in a pixel may receive photons (and break down) at roughly the same time, their respective individual pulse generators may output a pulse, and the pulses overlap temporally. Accordingly, the control circuitry would then output a timing signal during the period of time where the pulses overlapped temporally (see e.g., FIG. 3 timing diagram 300B "all SPAD out"). Thus, in some examples, the timing signal has a duration equal to or less than the fixed pulse duration time of the plurality of pulses output from the plurality of pulse generators.

In some examples, outputting the timing signal may include receiving the plurality of pulses with AND gates coupled to the plurality of pulse generators, and the AND gates output the timing signal. It is appreciated that the plurality of AND gates may include a plurality of NAND gates coupled to one or more NOR gates, or other equivalent/similar logic structures.

Block 509 shows in response to the timing signal, calculating a time when a first avalanche photodiode in the plurality of avalanche photodiodes received the light. It is appreciated the timing signal has a rising edge and a falling edge, and the plurality of pulses have a fixed pulse duration time. Thus, the time when the first avalanche photodiode received the light is calculated by subtracting the fixed pulse duration time from when the falling edge of the timing signal occurs.

Block 511 depicts calculating the time-of-flight using the time when the first avalanche photodiode received the light. In some examples, it is also possible to calculate when a last avalanche photodiode in the plurality of photodiodes received the light. This is because the rising edge of the timing signal is when the last avalanche photodiode broke down. While in some examples, it may be preferable to calculate when the first photon was received and not the last, in other examples it may be useful to calculate both times. If the system uses both edges (this may require two TDCs, see e.g., FIG. 4), the system can measure the correlation (time between first and last photons in a single $T_{WIN}$) and this indicates the reflectivity of the target and is desirable in LiDAR applications. Put another way, the system can calculate a difference in time between when the first avalanche photodiode received the light and when the last avalanche photodiode received the light as a way to measure reflectivity.

As stated above, in some examples calculating the time-of-flight includes using a first time to digital converter (TDC) and a second TDC coupled to receive the timing signal and included in the control circuitry. Additionally, control circuitry may include a first D flip-flop and a second D flip-flop coupled to the first D flip-flop to receive a lock signal from the first D flip-flop. And the second D flip-flop is coupled to the first TDC. Similarly, a fourth D flip-flop may be coupled to a third D flip-flop to receive a lock signal from the third D flip-flop. And the fourth D flip-flop is coupled to the second TDC.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of calculating a time-of-flight (TOF), comprising:
   emitting light from a light source;
   receiving the light reflected from an object with a plurality of avalanche photodiodes;
   in response to receiving the light with the plurality of avalanche photodiodes, outputting a plurality of pulses from individual pulse generators included in a plurality of pulse generators, wherein the individual pulse generators are electrically coupled to individual avalanche photodiodes included in the plurality of avalanche photodiodes that received the light;
   in response to outputting the plurality of pulses, outputting a timing signal when the plurality of pulses overlap temporally, and wherein the timing signal is generated with control circuitry;
   in response to the timing signal, calculating a time when a first avalanche photodiode included in the plurality of avalanche photodiodes received the light; and
   calculating the time-of-flight of the light using the time when the first avalanche photodiode received the light.

2. The method of claim 1, wherein the timing signal has a rising edge and a falling edge, wherein the plurality of pulses have a fixed pulse duration time, and wherein the time when the first avalanche photodiode received the light is calculated by subtracting the fixed pulse duration time from when the falling edge of the timing signal occurs.

3. The method of claim 2, wherein the timing signal has a duration equal to or less than the fixed pulse duration time of the plurality of pulses output from the plurality of pulse generators.

4. The method of claim 1, further comprising:
   in response to the timing signal, calculating when a last avalanche photodiode included in the plurality of photodiodes received the light.

5. The method of claim 4, further comprising:
   calculating a difference in time between when the first avalanche photodiode received the light and when the last avalanche photodiode received the light.

6. The method of claim 1, wherein the control circuitry includes a plurality of AND gates to output the timing signal.

7. The method of claim 6, wherein the plurality of AND gates include a plurality of NAND gates coupled to one or more NOR gates.

8. The method of claim 1, wherein calculating the time-of-flight includes using a first time to digital converter (TDC) and a second TDC coupled to receive the timing signal, and wherein the first TDC and the second TDC are included in the control circuitry.

9. The method of claim 8, wherein the control circuitry further comprises:
   a first D flip-flop;
   a second D flip-flop coupled to the first D flip-flop to receive a lock signal from the first D flip-flop, and wherein the second D flip-flop is coupled to the first TDC;
   a third D flip-flop; and
   a fourth D flip-flop coupled to the third D flip-flop to receive a lock signal from the third D flip-flop, and wherein the fourth D flip-flop is coupled to the second TDC.

* * * * *